(12) United States Patent
Cook et al.

(10) Patent No.: US 8,617,447 B2
(45) Date of Patent: *Dec. 31, 2013

(54) METHODS OF MAKING AN UNSUPPORTED ARTICLE OF PURE OR DOPED SEMICONDUCTING MATERIAL

(75) Inventors: Glen Bennett Cook, Elmira, NY (US); Prantik Mazumder, Ithaca, NY (US); Kamal Kishore Soni, Painted Post, NY (US); Balram Suman, Painted Post, NY (US); Christopher Scott Thomas, Horseheads, NY (US); Natesan Venkataraman, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 578 days.

This patent is subject to a terminal disclaimer.

(21) Appl. No.: 12/523,274

(22) PCT Filed: Feb. 27, 2009

(86) PCT No.: PCT/US2009/001268
§ 371 (c)(1),
(2), (4) Date: Jul. 15, 2009

(87) PCT Pub. No.: WO2009/108358
PCT Pub. Date: Sep. 3, 2009

(65) Prior Publication Data
US 2011/0033643 A1 Feb. 10, 2011

Related U.S. Application Data

(60) Provisional application No. 61/067,679, filed on Feb. 29, 2008.

(51) Int. Cl.
*C30B 28/04* (2006.01)

(52) U.S. Cl.
USPC ........... 264/306; 264/301; 264/327; 264/332; 428/446; 117/73; 117/74

(58) Field of Classification Search
None
See application file for complete search history.

(56) References Cited

U.S. PATENT DOCUMENTS

| | | | |
|---|---|---|---|
| 3,948,650 A | 4/1976 | Flemings et al. | 75/135 |
| 4,112,135 A * | 9/1978 | Heaps et al. | 438/479 |
| 4,128,680 A | 12/1978 | Heaps et al. | 428/137 |
| 4,137,355 A | 1/1979 | Heaps et al. | 428/201 |
| 4,243,472 A | 1/1981 | O'Neill | 156/624 |

(Continued)

FOREIGN PATENT DOCUMENTS

| | | |
|---|---|---|
| DE | 37 26 022 | 2/1989 |
| EP | 0 115 711 | 8/1984 |

(Continued)

OTHER PUBLICATIONS

T. Takakura et al., "Effect of Rapid Thermal Process for CDS Silicon Solar Cell", 23rd European Photovoltaic Solar Energy Conference, Sep. 1-5, 2008, Valencia, Spain, pp. 1472-1474.

(Continued)

*Primary Examiner* — Benjamin Schiffman
(74) *Attorney, Agent, or Firm* — Michael W. Russell

(57) ABSTRACT

The invention relates to methods of making articles of semiconducting material and semiconducting material articles formed thereby, such as articles of semiconducting material that may be useful in making photovoltaic cells.

8 Claims, 8 Drawing Sheets

(56) References Cited

U.S. PATENT DOCUMENTS

| | | | |
|---|---|---|---|
| 4,251,570 A | 2/1981 | Zook | 427/74 |
| 4,447,289 A | 5/1984 | Geissler et al. | 156/608 |
| 4,778,478 A | 10/1988 | Barnett | 437/5 |
| 5,712,199 A | 1/1998 | Nakagawa et al. | 438/62 |
| 6,231,667 B1 | 5/2001 | Iwane et al. | 117/55 |
| 6,413,313 B1* | 7/2002 | Yoshida et al. | 117/200 |
| 6,581,415 B2 | 6/2003 | Chandra et al. | 65/66 |
| 6,596,075 B2 | 7/2003 | Igarashi et al. | 117/26 |
| 6,682,990 B1 | 1/2004 | Iwane et al. | 438/458 |
| 6,746,225 B1 | 6/2004 | McHugh | 425/130 |
| 6,802,900 B2 | 10/2004 | Iwane et al. | 117/54 |
| 6,946,029 B2 | 9/2005 | Tsukuda et al. | 117/16 |
| 7,071,489 B2 | 7/2006 | Tsukuda | 257/75 |
| 7,111,476 B2 | 9/2006 | Loxley et al. | 65/17.2 |
| 7,186,578 B2 | 3/2007 | Goma et al. | 438/22 |
| 7,294,197 B1 | 11/2007 | Gralenski | 117/37 |
| 7,771,643 B1* | 8/2010 | Cook et al. | 264/305 |
| 2001/0044163 A1 | 11/2001 | Tsukuda et al. | 438/22 |
| 2005/0239225 A1* | 10/2005 | Goma et al. | 438/22 |
| 2006/0160336 A1* | 7/2006 | Mizutani et al. | 438/488 |
| 2009/0004835 A1 | 1/2009 | Drevet et al. | 438/486 |
| 2010/0290946 A1* | 11/2010 | Cook et al. | 420/555 |

FOREIGN PATENT DOCUMENTS

| | | |
|---|---|---|
| EP | 1 113 096 | 7/2001 |
| EP | 2 014 802 | 1/2009 |
| JP | 60-213351 | 10/1985 |
| JP | 2002 080295 | 3/2002 |
| WO | 2005/104244 | 11/2005 |
| WO | 2005/117079 | 12/2005 |
| WO | 2009/002550 | 12/2008 |

OTHER PUBLICATIONS

H. Mitsuyasu et al., "Characteristics of CDS Silicon Wafers", 23rd European Photovoltaic Solar Energy Conference, Sep. 1-5, 2008, Valencia, Spain, pp. 1497-1498.

R. O. Bell et al., "Growth of silicon sheets for photovoltaic applications", J. Materials Research, vol. 13, No. 10, Oct. 1998, pp. 2732-2739.

H. Yamatsugu et al., "Crystallization on dipped substrate wafer technology for crystalline silicon solar cells reduces wafer costs", Photovoltaics International journal's 2nd ed., Nov. 2008, www.pv-tech.org, p. 32-35.

Hide, I., et al., "Mould Shaping Silicon Crystal Growth With a Mould Coating Material by the Spinning Method" Journal of Crystal Growth 79, 1986, p. 583-589.

* cited by examiner

METHODS OF MAKING AN UNSUPPORTED ARTICLE OF PURE OR DOPED SEMICONDUCTING MATERIAL

This application claims priority to U.S. Provisional Patent Application No. 61/067,679, filed Feb. 29, 2008, titled "METHOD OF MAKING AN UNSUPPORTED ARTICLE OF A PURE OR DOPED SEMICONDUCTING ELEMENT OR ALLOY."

FIELD

The invention relates to methods of making an unsupported article of semiconducting material and semiconducting material articles formed thereby, such as articles of semiconducting material that may be useful in making photovoltaic cells.

BACKGROUND

Semiconducting materials find uses in many applications. For example, semiconducting materials can be used in electronic devices as processors formed on semiconductor wafers. As a further example, semiconducting materials can also be used to convert solar radiation into electrical energy through the photovoltaic effect.

For silicon-based photovoltaic cells, the silicon can be formed, for example, as an unsupported sheet or supported by forming the silicon on a substrate. Conventional methods for making unsupported and supported articles of semiconducting materials, such as silicon sheets, have several shortcomings.

Methods of making unsupported thin semiconducting material sheets, i.e., without an integral substrate, may be slow or wasteful of the semiconducting material feedstock. Bulk growth of semiconducting materials, such as, for example, single-crystal and polycrystalline silicon ingots, typically involve subsequent slicing of the ingot into thin sheets, leading to loss of material, e.g., approximately 50% kerf width from wire-sawing. Ribbon growth techniques overcome the loss of material due to slicing but may be slow, such as, for example, 1-2 cm/min for polycrystalline silicon ribbon growth technologies.

Supported semiconducting material sheets may be made less expensively, but the thin semiconducting material sheet is limited by the substrate on which it is made, and the substrate has to meet various process and application requirements, which may be conflicting.

Thus, there is a long-felt need in the industry for a method of making articles of a semiconducting material that may reduce material waste and/or increase the rate of production.

SUMMARY

In accordance with various exemplary embodiments of the invention are provided methods of making an article of semiconducting material comprising providing a mold at a temperature $T_{Mold}$, providing a molten semiconducting material at a bulk temperature $T_S$, wherein $T_S > T_{Mold}$, optionally coating an external surface of the mold with particles, immersing the mold in the molten semiconducting material for a period of time sufficient to form a solid layer of the semiconducting material over the external surface of the mold, withdrawing the mold with the solid layer of semiconducting material from the molten semiconducting material, and separating the solid layer of semiconducting material from the mold to form the unsupported article of the semiconducting material.

Other exemplary embodiments of the invention relate to methods of making an article of semiconducting material comprising providing a mold at a temperature $T_{Mold}$, providing a molten semiconducting material at a bulk temperature $T_S$, wherein $T_S > T_{Mold}$, optionally coating an external surface of the mold with particles, immersing the mold in the molten semiconducting material for a period of time sufficient to form a solid layer of the semiconducting material over an external surface of the mold, wherein the temperature of the mold is altered only by the temperature of the molten semiconducting material, withdrawing the mold with the solid layer of semiconducting material from the molten semiconducting material, and separating the layer of semiconducting material from the mold to form the unsupported article of the semiconducting material.

Other exemplary embodiments of the invention relate to methods of controlling the thickness of an article of semiconducting material comprising providing a mold at a temperature $T_{Mold}$, providing a molten semiconducting material at a bulk temperature $T_S$, wherein $T_S > T_{Mold}$, optionally coating an external surface of the mold with particles, immersing the mold in the molten semiconducting material for a period of time sufficient for a solid layer of semiconducting material to form over an external surface of the mold and begin to remelt, withdrawing the mold with the solid layer of semiconducting material from the molten semiconducting material, and separating the layer of semiconducting material from the mold to form the unsupported article of the semiconducting material.

Exemplary embodiments of the invention also relate to articles of semiconducting material formed by a method comprising providing a mold at a temperature $T_{Mold}$, providing a molten semiconducting material at a bulk temperature $T_S$, wherein $T_S > T_{Mold}$, optionally coating an external surface of the mold with particles, immersing the mold in the molten semiconducting material for a period of time sufficient for a solid layer of the semiconducting material to form over an external surface of the mold, withdrawing the mold with the solid layer of semiconducting material from the molten semiconducting material, and separating the layers of semiconducting material from the mold to form the unsupported article of the semiconducting material.

Further exemplary embodiments of the invention relate to molds for forming articles of semiconducting material, wherein the mold comprises an external surface and particles on the external surface.

The methods according to the present invention may, in at least some embodiments, reduce material waste and/or increase the rate of production of the semiconducting material.

As used herein, the term "semiconducting material" includes materials that exhibit semiconducting properties, such as, for example, silicon, germanium, tin, and gallium arsenide, as well as alloys, compounds and mixtures thereof. In various embodiments, the semiconducting material may be pure (such as, for example, intrinsic or i-type silicon) or doped (such as, for example, silicon containing a n-type or p-type dopant, such as phosphorous or boron, respectively).

As used herein, the phrase "article of semiconducting material" includes any shape or form of semiconducting material made using the methods of the present invention. Examples of such articles include articles that are smooth or textured; articles that are flat, curved, bent, or angled; and articles that are symmetric or asymmetric. Articles of semiconducting materials may comprise forms such as, for example, sheets or tubes.

As used herein, the term "unsupported" means that an article of semiconducting material is not integral with a mold.

The unsupported article may be loosely connected to the mold while it is being formed, but is separated from the mold after it is formed over the mold. The unsupported article may, however, be subsequently applied on a substrate for various applications, such as photovoltaic applications.

As used herein, the term "mold" means a physical structure that can influence the final shape of the article of semiconducting material. Molten or solidified semiconducting material need not actually physically contact a surface of the mold in the methods described herein, although contact may occur between a surface of the mold and the molten or solidified semiconducting material.

As used herein, the term "external surface of the mold" means a surface of the mold that may be exposed to a molten semiconducting material upon immersion. For example, the interior surface of a tube-shaped mold may be an external surface if the internal surface can contact a molten semiconducting material when the mold is immersed.

As used herein, the phrase "form a solid layer of semiconducting material over an external surface of the mold" and variations thereof mean that semiconducting material from the molten semiconducting material solidifies (also referred to herein as freezing or crystallizing) on, over, or near an external surface of the mold. Forming a solid layer of semiconducting material over an external surface of the mold may, in some embodiments, include solidifying semiconducting material on a layer of particles that coat an external surface of the mold. In various embodiments, due to the temperature difference between the mold and the molten semiconducting material, the semiconducting material may solidify before it physically contacts the external surface of the mold. When the semiconducting material solidifies before it physically contacts the mold, the solidified semiconducting material may, in some embodiments, subsequently come into physical contact with the mold or with particles coating the mold. The semiconducting material may, in some embodiments, also solidify after physically contacting the external surface of the mold, or particles coating the external surface of the mold, if present.

As used herein, the phrase "increased rate of production" and variations thereof include any increase in the rate of semiconducting material article production with respect to conventional methods for producing semiconducting material, such as ribbon growth methods. For example, an increased rate of production may be any rate greater than 1-2 cm/min.

As used herein, the phrase "reduced material waste" and variations thereof mean any reduction in the amount of semiconducting material lost through conventional methods using slicing or cutting following production of the article of semiconducting material.

As used herein, the term "crystalline" means any material comprising a crystal structure, including, for example, single crystalline and multicrystalline semiconducting materials.

As used herein, the term "multicrystalline" includes any material comprised of a plurality of crystal grains. For example, multicrystalline materials may include polycrystalline, microcrystalline, and nanocrystalline materials.

As used herein, the terms, "temperature of the molten semiconducting material," "bulk temperature of the molten semiconducting material," and variations thereof mean the average temperature of the molten semiconducting material contained within a suitable vessel. Localized temperatures within the molten semiconducting material may vary at any point in time, such as, for example, areas of the molten semiconducting material proximate to the mold when the mold is immersed, or molten semiconducting material exposed to the atmospheric conditions at the top surface of the vessel. In various embodiments, the average temperature of the molten semiconducting material is substantially uniform despite any localized temperature variation.

As described herein, the invention relates to methods of making articles of semiconducting material and semiconducting material articles formed thereby. In the following description, certain aspects and embodiments will become evident. It should be understood that the invention, in its broadest sense, could be practiced without having one or more features of these aspects and embodiments. It should be understood that these aspects and embodiments are merely exemplary and explanatory, and are not restrictive of the invention as claimed.

BRIEF DESCRIPTION OF DRAWINGS

The following figures, which are described below and which are incorporated in and constitute a part of the specification, illustrate exemplary embodiments of the invention and are not to be considered limiting of the scope of the invention, for the invention may admit to other equally effective embodiments. The figures are not necessarily to scale, and certain features and certain views of the figures may be shown exaggerated in scale or in schematic in the interest of clarity and conciseness.

DETAILED DESCRIPTION

It is to be understood that both the foregoing general description and the following detailed description are exemplary and explanatory only, and are not restrictive of the invention. Other embodiments of the invention will be apparent to those skilled in the art from consideration of the specification and practice of the invention disclosed herein.

Figure 1:
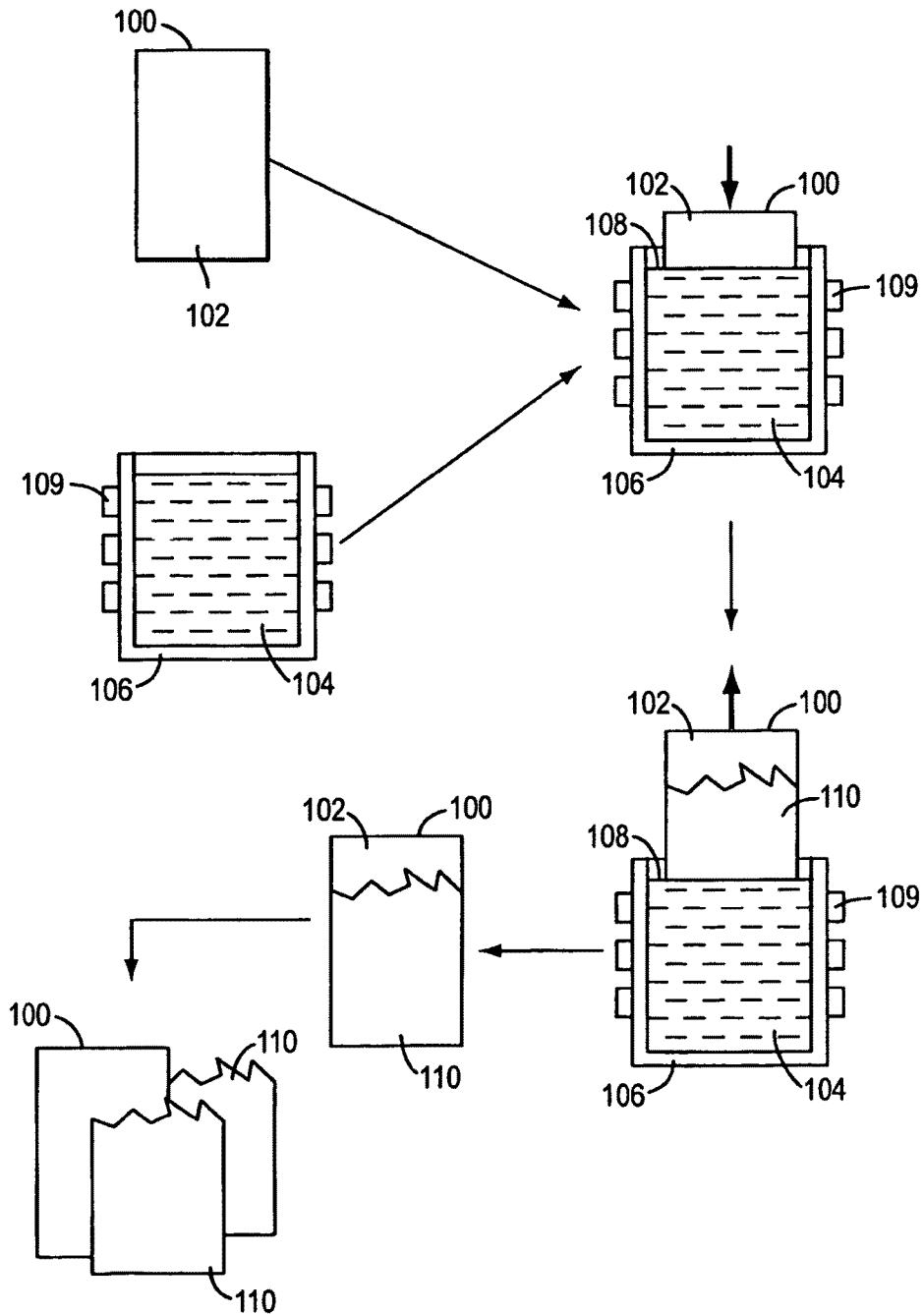
FIG. 1 is a schematic illustration of an exemplary method of making an unsupported article of semiconducting material according to an embodiment of the present invention.

FIG. 1 illustrates an exemplary method of making an unsupported article of a semiconducting material. The exemplary method is an exocasting process that casts the article on a surface, such as an external surface, of a mold, rather than only filling a mold cavity. In the exemplary method shown in FIG. 1, mold 100 is provided having an external surface 102 with a desired size (surface area), shape, and surface texture/pattern. The surface area, shape, and surface texture/pattern of the external surface 102 of the mold 100 may determine the size, shape, and surface texture/pattern of the cast article. One of ordinary skill in the art would recognize that the size, shape, and surface texture/pattern of the external surface 102 of the mold 100 can be selected based on, for example, the desired properties and features of the cast article.

Molten semiconducting material 104 such as, for example, molten silicon, may in at least one embodiment be provided by melting silicon in a vessel, such as a crucible 106, which may optionally be non-reactive with the silicon. In at least one embodiment, molten semiconducting material 104 may have low contaminant levels. For example, molten semiconducting material 104 may comprise less than 1 ppm of iron, manganese, and chromium, and/or less than 1 ppb of vanadium, titanium, and zirconium. Molten semiconducting material 104 may also comprise less than $10^{15}$ atoms/cm$^3$ of nitrogen and/or less than $10^{17}$ atoms/cm$^3$ of carbon. In at least one embodiment, the source of the semiconducting material may be photovoltaic-grade or purer silicon.

In one exemplary embodiment of the invention, mold 100 may be brought to a temperature, $T_{Mold}$, in a low oxygen or reducing atmosphere using any suitable heating device or method. Examples of suitable heating devices and methods include heating elements, such as resistive or inductive heating elements, and a flame heat source. One skilled in the art would recognize that the choice of heating device or method may be made based on factors such as, for example, the environment in which the mold is heated, the material of the mold, the thickness of the mold, and/or the desired level of contaminants in the final article produced.

In at least one embodiment, the molten semiconducting material 104 may be brought to a bulk temperature, $T_S$, in a low oxygen or reducing atmosphere using any suitable heating device or method. As described above, suitable heating devices and methods include heating elements and a flame heat source. As described above, one skilled in the art would recognize that the choice of a heat source depends on several factors such as, for example, the choice of semiconducting material, the capacity of the vessel containing the molten semiconducting material, the size/thickness of the vessel, and/or the atmosphere surrounding the vessel.

Prior to immersion, the temperature of the mold, $T_{Mold}$, may be less than the bulk temperature of the molten semiconducting material, $T_S$, to establish a temperature difference between the mold 100 and the molten material 104, which may drive the process. In various embodiments, the bulk temperature of molten material, $T_S$, may be the melting temperature of the semiconducting material, or may be a higher temperature. In one exemplary embodiment where the semiconducting material comprises silicon, the bulk temperature of the molten silicon, $T_S$, may range from 1414° C. to 1550° C., such as, for example, from 1450° C. to 1490° C., such as 1460° C.

In at least one embodiment, the temperature of the mold, $T_{Mold}$, may, for example, be chosen so that the mold 100 is able to cool the molten material adjacent the surface of mold 100 to the solidifying/freezing point of the semiconducting material 104, and to remove sufficient heat from the semiconducting material 104 to freeze it. In at least one embodiment of the invention, the temperature of the mold, $T_{Mold}$, may be chosen based, at least in part, on the thickness of mold 100. For example, as can be determined from the data presented in FIG. 2, a thicker mold may have the capacity to produce a thicker article of semiconducting material than a thinner mold when both molds have the same temperature at the time of immersion in the molten semiconducting material 104.

In at least one embodiment, the temperature of the mold, $T_{Mold}$, may range from −50° C. to 1400° C. prior to immersion in the molten semiconducting material 104. For example, in at least one embodiment, the temperature of the mold, $T_{Mold}$, may range from −35° C. to 0° C. prior to immersion in the molten semiconducting material 104. In a further embodiment, the temperature of mold, $T_{Mold}$, may range from 20° C. to 30° C. prior to immersion in the molten semiconducting material 104. In yet a further embodiment, the temperature of the mold, $T_{Mold}$, may range from 300° C. to 500° C. prior to immersion in the molten semiconducting material 104.

Figure 19:
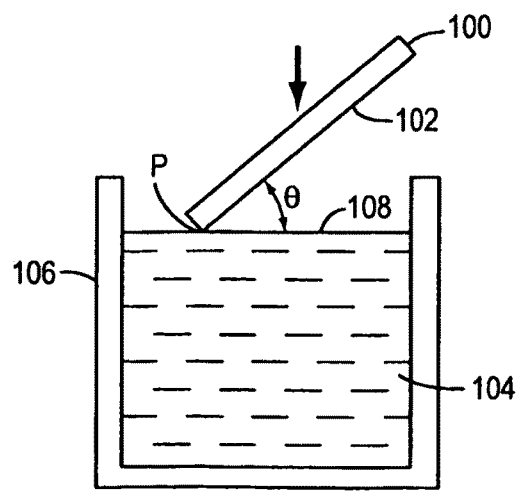
FIG. 19 is a schematic representation of an exemplary immersion angle of a mold as it is immersed in molten semiconducting material.

According to at least one embodiment, as shown in FIG. 1, mold 100 may be immersed in the molten semiconducting material 104 at a predetermined rate, optionally in a low oxygen or reducing atmosphere. Mold 100 may be immersed in molten semiconducting material 104 at any immersion angle θ, where immersion angle θ is the angle between the surface 108 of molten semiconducting material 104 and the external surface 102 of mold 100 at the point P that first contacts the surface 108 of molten semiconducting material 104 as shown in FIG. 19. The angle at which external surface 102 of mold 100 contacts molten semiconducting material 104 may vary as mold 100 is immersed in molten semiconducting material 104. By way of example only, in one embodiment, molten semiconducting material could contact a mold having a spherical external surface at an infinite number of angles as it is immersed, although the immersion angle θ would be 0° as the initial contact point would be parallel to the surface 108 of molten semiconducting material 104. In further exemplary embodiments, mold 100 may be moved in a direction parallel to surface 108 of molten semiconducting material 104 as mold 100 is immersed in a direction perpendicular to surface 108 of molten semiconducting material 104. One skilled in the art would also recognize that the local immersion angle, that is the immersion angle at any finite location at the point P of first contact may also vary due to the surface properties (such as, for example, porosity or height variations) and the wetting angle of the material comprising the mold.

In a further exemplary embodiment, external surface 102 of mold 100 may be substantially perpendicular to the surface 108 of the molten semiconducting material 104, i.e., the immersion angle is approximately 90°. In a further embodiment, the external surface 102 of mold 100 need not be perpendicular to the surface 108 of molten semiconducting material 104. By way of example, the external surface 102 of mold 100 may be immersed in the molten semiconducting material 104 at an immersion angle ranging from 0° to 180°, such as from 0° to 90°, from 0° to 30°, from 60° to 90°, or at an immersion angle of 45°.

In at least one embodiment of the present invention, immersion of the mold may be accomplished using any suitable technique, and may be accomplished by immersing the mold from above the molten semiconducting material or from the side or bottom of the molten semiconducting material.

In at least one embodiment, mold 100 may be immersed in the molten semiconducting material 104 for a period of time sufficient to allow a layer of the semiconducting material to sufficiently solidify on a surface 102 of mold 100. In at least one embodiment, the semiconducting material is sufficiently solidified when enough semiconducting material has solidified that the mold can be withdrawn from the molten semiconducting material and the layer of solidified semiconducting material will be withdrawn with the mold. By way of example only, the mold 100 may be immersed in the molten semiconducting material 104 for up to 30 seconds or more depending on the thickness of mold 100. In at least one embodiment, the mold 100 may be immersed from 0.5 seconds to 30 seconds, such as up to 10 seconds. By way of example, mold 100 may be immersed in the molten semiconducting material 104 for 1 second to 4 seconds. The immersion time may be varied appropriately based on parameters known to those of skill in the art, such as, for example, the thickness of the mold, the temperatures and heat transfer properties of the mold and the molten semiconducting material, and the desired thickness of the formed article of semiconducting material.

In at least one embodiment, at least one heating element 109, such as resistive heating elements or inductive heating elements, may be used to heat the vessel 106 and maintain the molten semiconducting material 104 at a desired temperature while mold 100 is immersed. In at least one embodiment, the temperature of the molten semiconducting material 104 may be maintained at the bulk temperature, $T_S$. The semiconducting material 104 can be melted and maintained in molten form by any desired method, and the selection of the heating method would be within the skill of one in the art based on the conditions and environment where the method is performed. In at least one embodiment of the present invention, a reducing environment radio frequency (RF) induction heating may be used. RF induction heating may provide a cleaner environment by minimizing the possibility of the presence of foreign matter in the melt. Induction can also provide the heat flux needed to maintain the desired bulk molten material temperature as the material near the surface of mold 100 extracts heat rapidly.

According to at least one embodiment, mold 100 may be held essentially motionless in the plane parallel to the surface 108 of molten semiconducting material 104 as it is immersed in a direction perpendicular to surface 108 of molten semiconducting material 104. In other embodiments, mold 100 may be moved in the plane parallel to the surface 108 of molten semiconducting material 104, for example rotated or vibrated at any appropriate frequency, when it is immersed in a direction perpendicular to the surface 108 of molten semiconducting material 104. A layer of semiconducting material 110 may form over the surface 102 of mold 100. After immersion, mold 100 with a layer of semiconducting material 110 may be withdrawn from the vessel 106. In at least one embodiment, mold 100 with a layer of semiconducting material 110 may be cooled after it is removed from vessel 106, either actively such as by convective cooling, or by allowing the temperature of the layer of semiconducting material 110 to come to room temperature. After mold 100 is removed from vessel 106 and sufficiently cooled, the solid layer of semiconducting material 110 may be removed or separated from mold 100 by any method known to those of skill in the art. In at least one embodiment, the layer of semiconducting material may be sufficiently cooled when it may be separated or removed from the mold without breaking or deforming. In at least one embodiment, the layer of semiconducting material 110 may be separated or removed from mold 100 by differential expansion and/or mechanical assistance.

In at least one embodiment, the semiconducting material may be chosen from silicon, germanium, tin, gallium arsenide, alloys thereof, and mixtures thereof. According to various embodiments, the semiconducting material may be pure or doped. In at least one embodiment of the invention, the semiconducting material comprises at least one dopant chosen from boron, phosphorous, or aluminum (B, P, or Al). In at least one embodiment, the at least one dopant is present in the part per million (ppm) range. The amount of dopant present in the molten semiconducting material may be chosen based on the desired dopant concentration in the produced article of semiconducting material and may depend on the final use of the article, such as, for example, a photovoltaic cell. According to at least one embodiment, an article of semiconducting material produced by the methods disclosed herein may comprise a dopant dispersed substantially evenly throughout the semiconducting material (e.g., without substantial segregation of the dopant within the semiconducting material).

In a further embodiment, the semiconducting material may comprise at least one non-semiconducting element that may form a semiconducting alloy or compound with another element. For example, the semiconducting material may be chosen from gallium arsenide (GaAs), aluminum nitride (AlN), and indium phosphide (InP).

In various embodiments of the present invention, a number of process parameters may be varied, including but not limited to: (1) the composition, density, heat capacity, thermal conductivity, thermal diffusivity, and thickness of the mold 100, (2) the temperature of the mold, $T_{Mold}$, at which it is provided prior to immersion and the bulk temperature of the molten semiconducting material, $T_S$, (3) the rate at which mold 100 is immersed into the molten material 104, (4) the length of time which mold 100 is immersed in the molten material 104, (5) the rate at which mold 100 having the layer of semiconducting material 110 is removed from the molten material 104, and (6) the rate of cooling of the solidified semiconducting material 110.

In at least one embodiment, the temperature of the mold, $T_{Mold}$, at which it is provided prior to immersion and the bulk temperature of the molten semiconducting material, $T_S$, are the only temperature parameters that are controlled (e.g., the temperature of the mold changes upon immersion in the molten semiconducting material while the temperature of the bulk molten semiconducting material is maintained at a constant temperature).

In at least one embodiment of the present invention, the temperature of mold 100 is not controlled after it is immersed in the molten semiconducting material 104, and thus its temperature is only altered by the temperature of the molten semiconducting material, $T_S$. The temperature of the molten semiconducting material, $T_S$, may alter the temperature of mold 100 through radiation, convection, or conduction. Radiative heating of mold 100 may occur, for example, when mold 100 is above molten semiconducting material 104. Mold 100 may be convectively heated by molten semiconducting material 104 when fumes above molten semiconducting material 104 pass over the surface of mold 100 or during immersion of mold 100 in the molten semiconducting material 104. Heating of mold 100 by conduction may occur, for example, while mold 100 is immersed in molten semiconducting material 104.

In at least one embodiment, mold 100 is made of a material that is compatible with the molten semiconducting material 104. For example, mold 100 may comprise a material such that when mold 100 is exposed to the molten material 104, mold 100 does not react with the molten material 104 in a manner that interferes with the methods disclosed herein, such as, for example, by forming a low-melting compound or solid solution. As a further example, mold 100 may comprise a material that does not melt or soften when mold 100 is heated via contact with the molten material 104. As a further example, mold 100 may comprise a material that does not become too fluid to support the solid layer 110 and/or does not separate from the solid layer 110 when mold 100 is heated via contact with the molten material 104. As a further example, mold 100 may comprise a material such that when mold 100 is heated via contact with the molten material 104, mold 100 does not check, fracture, or explode due to, for example, large thermal stresses generated from uneven, rapid thermal expansion, or from trapped gases. As yet a further example, mold 100 may comprise a material that does not deleteriously contaminate either the solidified layer 110 being formed on the mold or the molten material 104 residuum via breakage, spallation, dusting, and diffusion of vapor or liquid phases of solid components or evolved gases. In at least one embodiment, mold 100 may comprise a material chosen from vitreous silica, graphite, silicon nitride, and combinations thereof. In at least one embodiment of the present invention, mold 100 is made of vitreous silica.

Mold 100 may be in any form suitable for use in the disclosed methods. For example, in at least one embodiment, mold 100 may be in the form of a monolith or in the form of a laminated structure such as a laminated monolith. Mold 100 may comprise a porous or non-porous body, optionally with at least one porous or non-porous coating. In at least one embodiment, mold 100 may also comprise a uniform or non-uniform composition, uniform or non-uniform porosity, or other uniform or non-uniform structural characteristic throughout the mold body. According to at least one embodiment, mold 100 may also be in any shape suitable for use in the disclosed method. For example, mold 100 may comprise one or more flat surfaces or one or more curved surfaces, for example one or more convex or concave surfaces. For example, the one or more flat surfaces may be used to create an article in the shape of a rectangle, and the one or more convex or concave surfaces may be used to create an article in the shape of a lens or a tube.

In at least one embodiment, the thermophysical properties of the material of mold 100 and the thickness of mold 100 may combine to determine the capacity of mold 100 to extract heat from the molten material 104 in contact with or proximate to the external surface 102 of mold 100 causing the semiconducting material to solidify, as well as the rate at which the heat may be transferred. Without wishing to be limited by theory, it is believed that the rate at which heat is extracted from the solid layer 110 over the external surface 102 of mold 100 may affect the grain size of the solid semiconducting material layer 110. The temperature difference between mold 100 and molten material 104 may provide a driving force for the liquid-to-solid phase transformation, while the heat transfer properties (conductivity and diffusivity) of mold 100 may set the rate at which the heat can be removed. A larger temperature difference may, in general, provide a larger driving force, which may result in a finer grained material as more energy may be available to surmount the nucleation barrier at a greater number of sites. A smaller temperature difference may favor larger grains.

Figure 2:
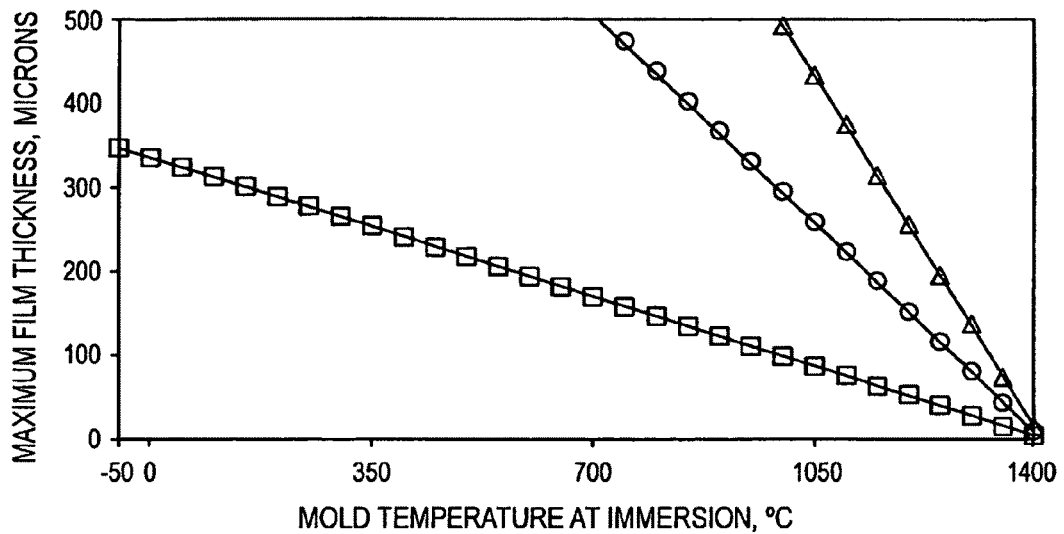
FIG. 2 is a graph illustrating the relationship between the mold temperature at the time of immersion and the maximum thickness of a silicon film for various mold thicknesses according to an embodiment of the invention.

FIG. 2 shows an graphical representation of an exemplary theoretical calculation illustrating the maximum thickness of a solidified silicon layer that may be achieved as a function of the mold temperature, $T_{Mold}$, at the time of immersion corresponding to mold thicknesses of 1 mm, 3 mm and 5 mm, as illustrated by squares, circles, and triangles, respectively. In the calculations, it was assumed that the mold is made of 100% dense (i.e., non-porous) vitreous silica and that the molten silicon is maintained at 1470° C. during immersion of the mold in the molten silicon. The graphs shown in FIG. 2 are generated by solving the energy balance equation below for the given mold material's physical properties. The maximum thickness of solidified silicon layer, $\Delta$, formed while the mold is immersed in the molten semiconducting material can be expressed as a function (EQ. 1) of the mold density, $\rho_{Mold}$, the mold heat capacity, $Cp_{Mold}$, the temperature of the mold, $T_{Mold}$, at the time of immersion, the silicon melting temperature, $T_M$, the bulk temperature of the molten silicon, $T_S$, the thickness of the mold, W, the molten silicon density, $\rho_{Si}$, the specific heat capacity of molten silicon, $Cp_{Si}$, and the latent fusion heat of silicon, $\lambda_{Si}$:

$$\Delta = \frac{1}{2}\left[\frac{\rho_{Mold}Cp_{Mold}W(T_M - T_{Mold})}{\rho_{Si}\lambda_{Si} + \rho_{Si}Cp_{Si}(T_S - T_M)}\right] \quad \text{(EQ. 1)}$$

Figure 18:
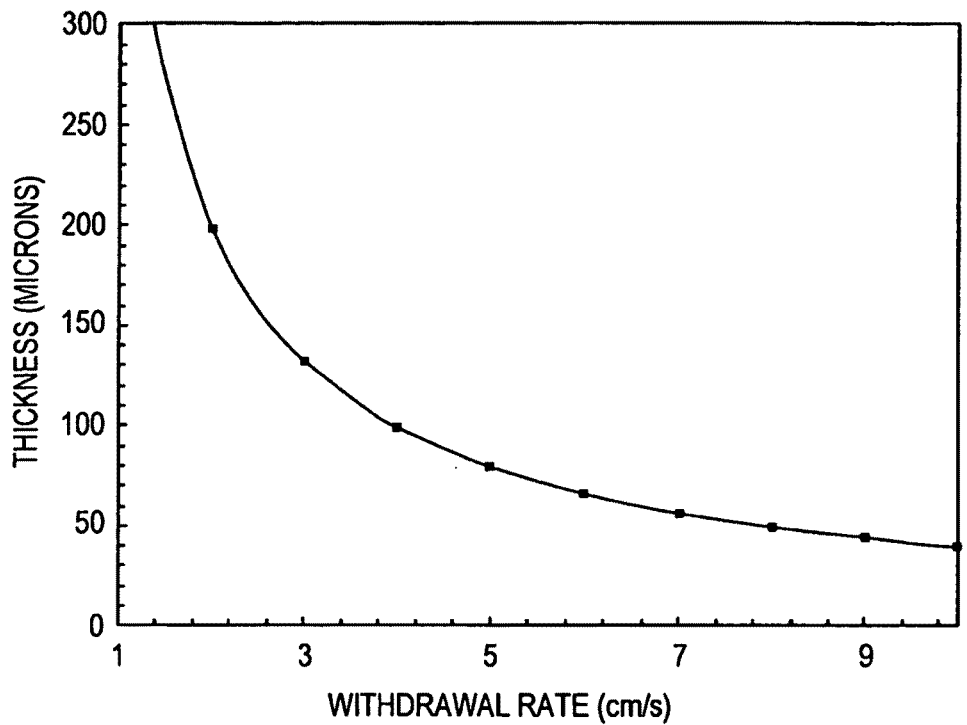
FIG. 18 is a graph illustrating the thickness of a drag layer of molten semiconducting material as a function of the rate at which the mold is withdrawn from the molten semiconducting material.

In addition to the thickness of semiconducting material contributed by the freezing/remelting of the semiconducting material over a surface of the mold, the thickness of the formed article of semiconducting material may also be affected by the rate at which mold 100 is withdrawn from molten semiconducting material 104. Molten semiconducting material may wet the solid layer 110 of semiconducting material formed over the mold 100 as it is withdrawn from molten semiconducting material 104, forming a drag layer of molten semiconducting material. The drag layer of molten semiconducting material may freeze on the already solidified layer of semiconducting material and thus may add to the thickness of the final article. Without wishing to be bound by any theory, it is believed that the additional thickness that may be added by the drag layer may be attributed to the freezing/remelting process that occurs while the mold is immersed in the molten semiconducting material, as explained above, as well as coating that may occur in a conventional dip-coating process. The thickness of a layer formed using a conventional dip-coating process may be approximated using the Landau-Levich equation (EQ. 2):

$$H = 0.944 \ast (\mu U/\sigma)^{1/6} \ast (\mu U/\rho g)^{1/2} \quad \text{(EQ. 2)}$$

where H is the thickness of the dip-coated layer, $\mu$ is the liquid viscosity (e.g., the molten semiconducting material), U is the velocity of the mold as it is removed, $\sigma$ is the surface tension of the liquid, $\rho$ is the density of the liquid, and g is acceleration due to gravity. The contribution of the additional thickness due to freezing may be a function of the length of the mold divided by the withdrawal rate of the mold from the molten semiconducting material. Thus, the thickness of the drag layer may decrease as the withdrawal rate is increased, as shown in FIG. 18. By way of example, in one embodiment where the mold is withdrawn at a rate ranging from 2 cm/s to 5 cm/s, the drag layer may contribute 100 μm to the thickness of the formed semiconducting material article.

Figure 3:
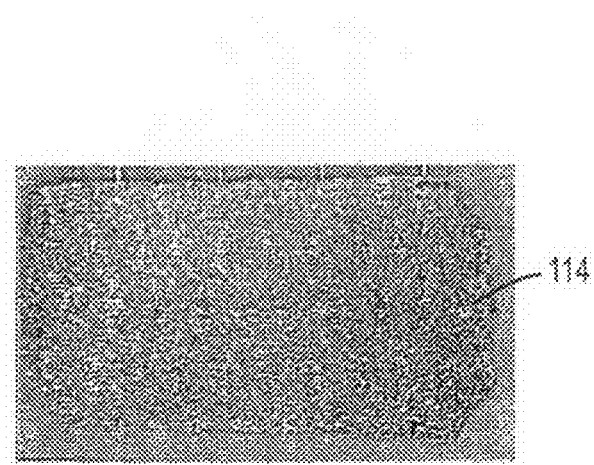
FIG. 3 is a photograph of an unsupported silicon article made according to an exemplary method of the present invention.
Figure 4:
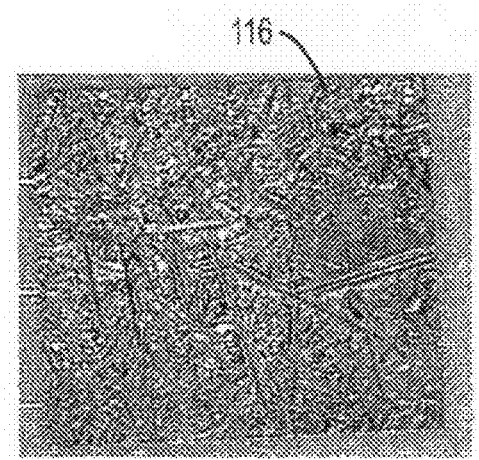
FIG. 4 is a photograph of an unsupported silicon article made according to an exemplary method of the present invention.

FIGS. 3 and 4 are photographs of articles of semiconducting material made according to embodiments of the present disclosure. FIGS. 3 and 4 show two unsupported silicon articles 114 and 116, respectively, both approximately 300 μm thick, cast by the methods described herein, with the same initial temperature difference between the molds and molten silicon. The silicon article 114 in FIG. 3 was cast using a fully-dense, transparent, vitreous silica mold resulting in smaller grains (approximately 100 μm) in the silicon article. The silicon article 116 in FIG. 4 was cast using a mold of an opaque 80% dense (i.e., porous), sintered, vitreous silica refractory. Silicon article 116 exhibited larger grains (greater than 1 mm).

Figure 5:
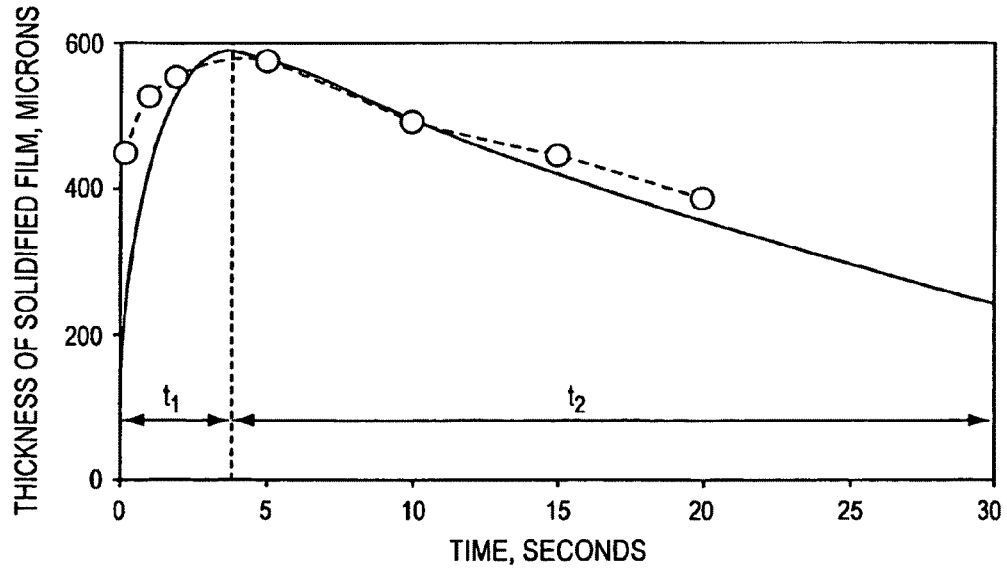
FIG. 5 is a graph illustrating the relationship between a thickness of a solid silicon layer formed on a mold and the immersion time of the mold in molten silicon according to an embodiment of the invention.

In at least one embodiment of the present invention, the thickness of the resulting solid layer may be controlled by altering the immersion time of mold 100 in the molten semiconducting material 104. FIG. 5 shows a calculated graph of solidification distance (solid line), measured from the external surface 102 of mold 100, as a function of immersion time. FIG. 5 also shows a set of experimental data (dotted line with circles) corresponding to the processing conditions of the calculation. In at least some embodiments of the processes described herein, the solidified layer (e.g., silicon) initially rapidly grows to a maximum possible thickness, shown during time period $t_1$. The solidified layer may then thin during time period $t_2$ as the solid semiconducting material remelts back into the bulk molten material, which may be maintained at a predetermined temperature. Without wishing to be limited by theory, it is believed that during the initial phase, solidification is initiated at the mold-liquid interface followed by the progression of the solidification front into the liquid (i.e., the molten semiconducting material), thereby leading to growth of a frozen layer of finite thickness. In the latter phase of the process, it is believed that remelting of the frozen layer takes place and the solid-liquid interface recedes towards the substrate wall. If the mold were left in the molten material, all of the initially frozen layer would remelt as the mold thermally equilibrates with the melt. The instantaneous velocity of the solid-liquid interface is given by the Stephan condition (EQ. 3):

$$K_S \frac{\partial T}{\partial x}\bigg|_S - K_L \frac{\partial T}{\partial x}\bigg|_L = v_i \rho_S \lambda \quad \text{(EQ. 3)}$$

where $K_S$ and $K_L$ are the thermal conductivities of the solid and liquid phase, $v_i$ is the instantaneous interface velocity, $\rho_S$ is the density of the solid phase and $\lambda$ the latent heat of fusion. The first and second terms on the left side of the equation are the heat fluxes through the solid and the liquid, respectively. If the heat flux through the solid is larger than the heat flux through the liquid, then the interface velocity is positive and the freezing continues. If the heat flux through the liquid is higher than the heat flux thorough the solid, the interface velocity is negative and remelting takes place. In at least one embodiment of the present invention, the thickness of the article of semiconducting material is controlled by immersing the mold in the molten semiconducting material for a period of time such that the heat flux through the molten semiconducting material is higher than the heat flux through the solidified semiconducting material and remelting takes place. As can be determined from the data presented in FIG. 5, the rate at which remelting takes place is slower than the rate of the initial formation of the solid semiconducting material layer. It is believed that because of the slower rate of change in the thickness, the thickness of the formed article can be more accurately controlled during the remelting phase.

When the mold is immersed in the molten semiconducting material, during the solidifying phase, the heat flux through the solid phase (the first term on left hand side of the equation) is much larger than that in the initially isothermal liquid, and therefore rapid solidification into the liquid takes place. After a certain length of time, the heat flux through the liquid is higher than that through the solid, and remelting takes place. After a sufficient period of time has elapsed, the entire solidified layer of semiconducting material remelts as the mold thermally equilibrates with the melt.

It is believed that, in at least certain embodiments, the solidification phase starts at the mold-liquid interface, followed by the progression of solidification into the liquid from the mold. The dynamics of this process may be controlled by the rate of latent heat generation at the solidification interface and its conduction away from the interface. For solidification into super-heated melt (i.e., where the temperature of the melt is greater than the melting point of the material), the temperature gradient ahead of the interface (i.e., in the direction of the melt) is expected to be positive. Therefore, the latent heat released at the solidifying/freezing front cannot be conducted or convected away into the melt. It is believed that the solidification dynamics are therefore set by the conduction of latent heat through the solidified semiconducting material into the mold (e.g., fused silica). The faster the conduction through the solidified semiconducting material and the mold, the faster is the solidification rate. Consequently, it is believed that the thermal properties of the mold can have a significant effect on the solidification dynamics. Conversely, it is believed that the temperature of the molten semiconducting material does not have much effect on the solidification phase. The solidification continues until the heat fluxes through the liquid (i.e., the molten semiconducting material) and the solid semiconducting material layer become equal. Beyond this point, the flux through the liquid is higher than that through the solid semiconducting material and remelting starts. During the remelting phase, latent heat is supplied to the interface from the superheated molten semiconducting material. Therefore, during the remelting phase, the properties of the molten semiconducting material have a greater effect on the remelting dynamics and the thermal properties of the mold do not have much effect.

In at least one embodiment of the present invention, mold 100 is made of vitreous silica molds having a thickness ranging from 0.5 mm to 5 mm. For a vitreous silica mold having a thickness ranging from 0.5 mm to 5 mm, it is believed that in approximately the first fraction of a second after immersion the primary solid semiconducting material layer, e.g., a silicon layer that solidified during immersion, is growing substantially parallel to a surface of the mold as heat is transferred from the molten silicon to the mold. After the initial substantially-parallel growth, it is believed that growth of the silicon layer proceeds substantially normal to a surface of the mold. The solid semiconducting material layer may grow until the heat flux across the solid-liquid interface is equal, then melt back into the molten semiconducting material.

According to at least one embodiment, the rate at which the mold is immersed into the molten semiconducting material may range from 1 cm/s to 50 cm/s, such as, for example, from 3 cm/s to 10 cm/s. One skilled in the art would recognize that the immersion rate may vary depending on various parameters, such as, for example, the semiconducting material composition (including optional dopants), the size/shape of the mold, and the surface texture of the mold.

Figure 6:
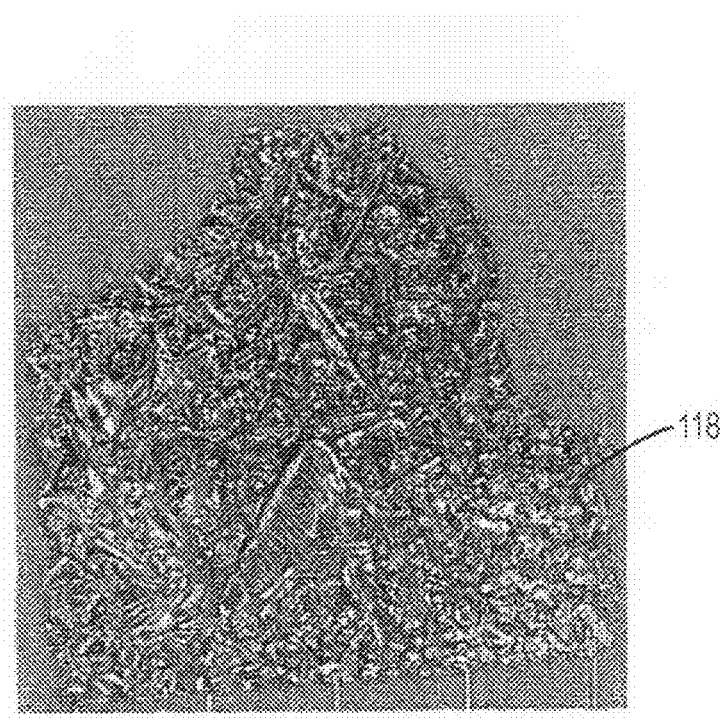
FIG. 6 is a photograph of an unsupported silicon article formed according to an exemplary embodiment of the invention.
Figure 7:
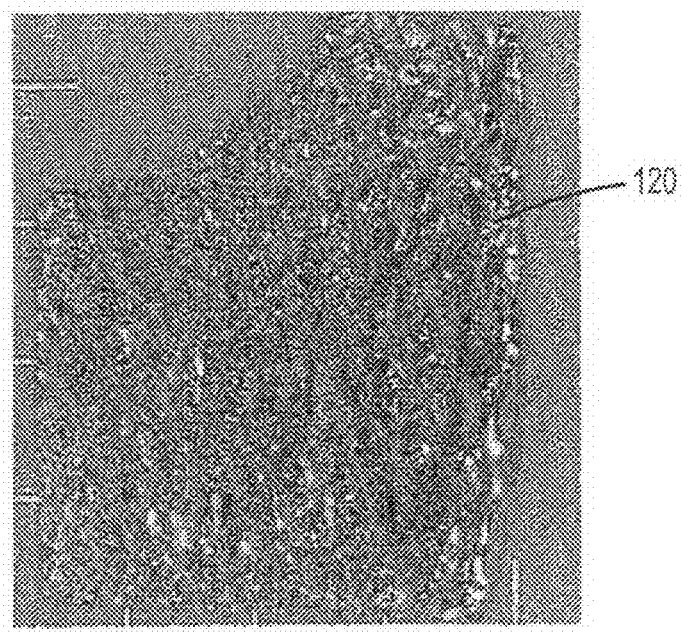
FIG. 7 is a photograph of an unsupported silicon article formed according to an exemplary embodiment of the invention.

The rate at which the mold is withdrawn from the molten material after immersion may also have an effect on the structure of the formed solid article. When the mold is withdrawn from the molten semiconducting material, a layer of molten semiconducting material may wet the surface of the solid layer of semiconducting material on the mold, which may add thickness to the solid layer of semiconducting material, as described above, and/or may change the surface structure of the solid layer of semiconducting material. FIGS. 6 and 7 show two silicon articles that demonstrate the effect of withdrawal rate on the smoothness of the formed solid article. In FIG. 6, the mold was withdrawn quickly, resulting in a silicon article 118 with a relatively rough surface. In FIG. 7, the mold was withdrawn slowly, resulting in a silicon article 120 with a relatively smooth surface. In at least one embodiment, solid articles having smoother surfaces can be made using a relatively slow withdrawal rate of the mold from the molten material, such as, for example, 2 to 5 cm/s. When the mold is withdrawn too quickly, small local variations in heat removal may manifest as isolated solidification events that trap extra liquid within them, forming puddles and bumps. As these puddles and bumps rapidly solidify, they may form blobs and faceted peaks, sometimes several millimeters tall and up to one centimeter wide. It is believed that slower withdrawal confines the wetted area to the liquid-solid-gas interface and puts a continuous secondary smooth layer on the surface of the solid layer. Furthermore, quickly moving the mold may induce flow patterns and even turbulence in the melt. The coupling between flow motion and heat transfer may cause pattern formation on the solidified surface of the article. In at least one embodiment, an article of semiconducting material is made by withdrawing the mold at a rate such that a secondary smooth layer is formed on the surface of the solid semiconducting material layer.

A person skilled in the art would recognize that the immersion rate, immersion time, and withdrawal rate may all affect the produced article and that these parameters may be chosen based on the desired article, the material/shape/texture/size of the mold, the starting temperature of the mold, the temperature of the molten semiconducting material, and the properties of the semiconducting material.

Returning to FIG. 1, in at least one embodiment, vessel 106, which holds the molten semiconducting material 104, may not react with the molten material 104 and/or may not contaminate the molten material 104 as described above for mold 100. In at least one embodiment, vessel 106 may be made from a material chosen from vitreous silica, graphite, and silicon nitride. In at least one embodiment, vessel 106 is made of vitreous silica.

Without wishing to be limited, it is believed that in at least certain embodiments, the use of vitreous silica for the mold 104 and/or vessel 106 may lead to oxygen contamination of the semiconducting material. Thus, in various embodiments, oxygen contamination may optionally be mitigated or substantially mitigated, such as by melting the semiconducting material and casting the article in a low-oxygen environment, such as, for example, a dry mixture of hydrogen (<1 ppm of water) and an inert gas such as argon, krypton or xenon. In at least one exemplary embodiment, the atmosphere may be chosen from an Ar/1.0 wt % $H_2$ mixture or an Ar/2.5 wt % $H_2$ mixture.

Figures 8, 9:
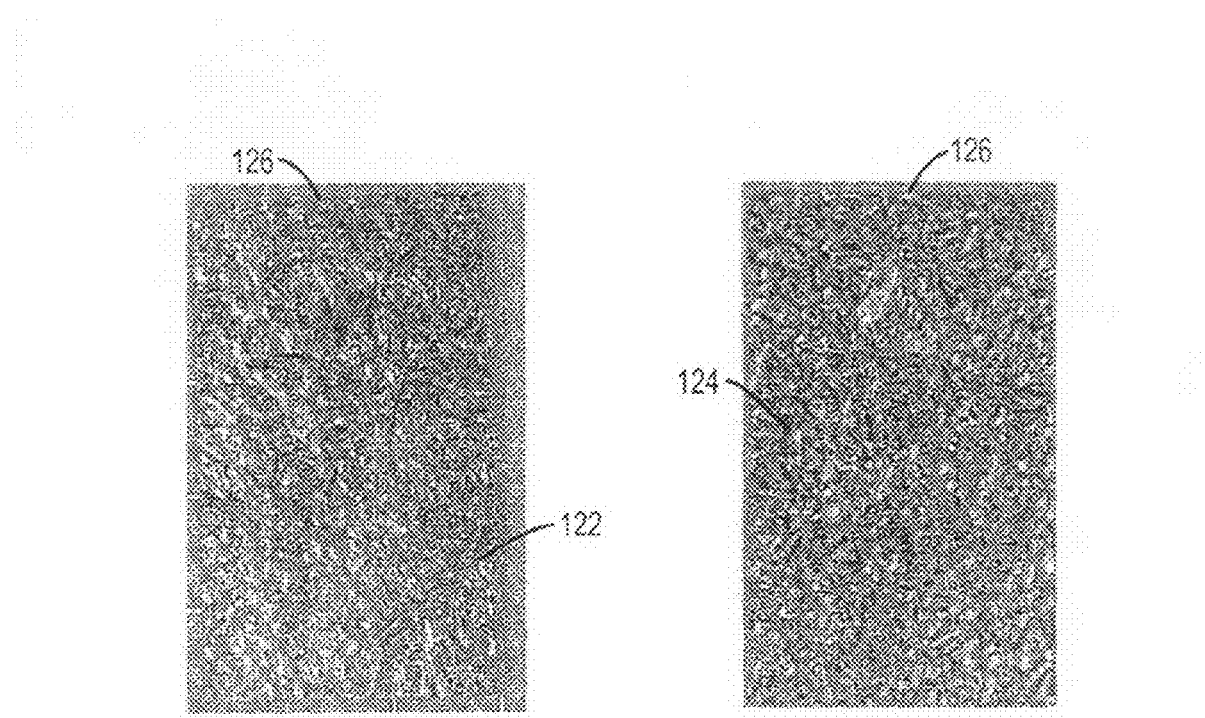
FIGS. 8 and 9 are photographs of the front side and back side, respectively, of a flat unsupported silicon article formed by an exemplary method according to the invention.

In at least one embodiment, mold 100 has an external surface 102 that is substantially flat. FIGS. 8 and 9 are photographs of the front side 122 and backside 124, respectively, of an exemplary silicon article 126 formed by a method of the invention on a flat surface of a mold 100, such as shown in FIG. 1. The thickness of silicon article 126 was 240 μm.

According to various embodiments described herein, thicker articles can be made by adjusting the properties of mold 100 and other process parameters, such as, for example, increasing the thickness of mold 100 or varying the immersion time.

Figures 10, 11:
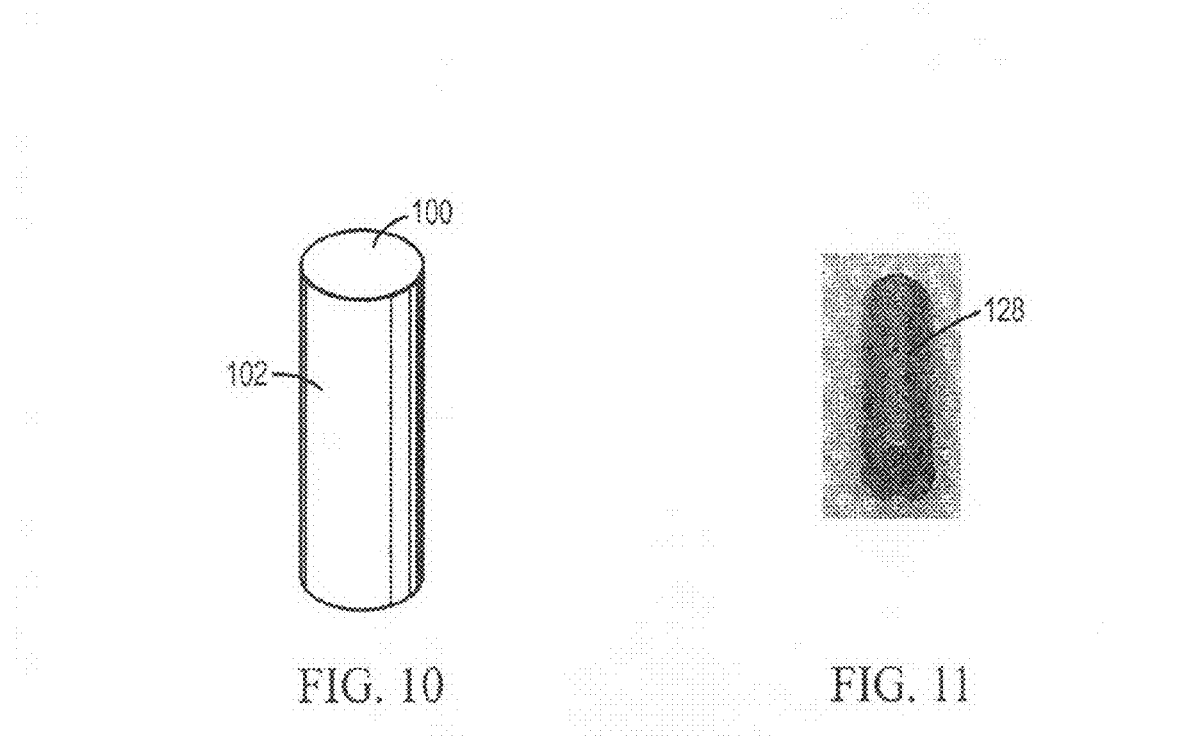
FIG. 10 shows a mold with a tubular external surface used in exemplary embodiments of the invention.
FIG. 11 is a photograph of an unsupported silicon article formed according to an exemplary embodiment of the invention using a mold such as shown in FIG. 10.
Figure 12:
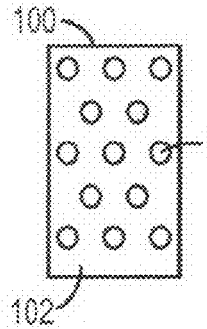
FIGS. 12 and 13 show exemplary textured molds used in accordance with exemplary methods of the invention.
Figure 13:
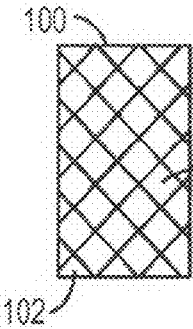
Figure 14:
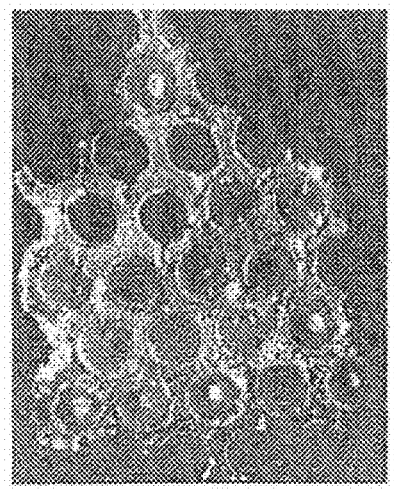
FIGS. 14 and 15 are photographs of unsupported silicon articles formed by exemplary methods of the invention using molds such as shown in FIGS. 12 and 13, respectively.
Figure 15:
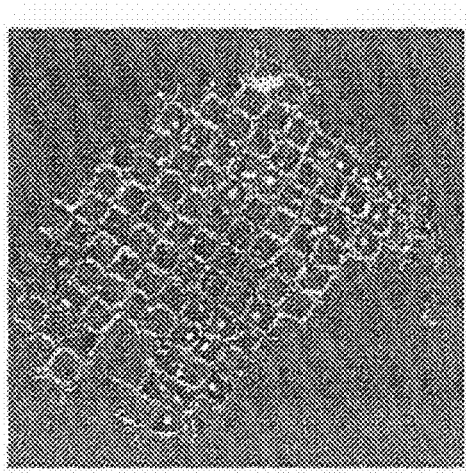

In at least one embodiment, mold 100 may have an external surface 102 with particular characteristics to form articles having a broad range of shapes, curvatures, and/or textures. For example, FIG. 10 depicts mold 100 with an external surface 102 that is tubular. FIG. 11 is a picture of a tubular silicon article 128 formed by a tubular mold 100 such as that shown in FIG. 10. FIGS. 12 and 13 depict molds 100 with a flat external surface 102 having holes or dimples 130. In FIG. 12, the holes or dimples 140 in the external surface 102 of mold 100 are circular in shape. In FIG. 13, the holes or dimples 114 in the external surface 102 of mold 100 are diamond-shaped. FIGS. 14 and 15 show holey or dimpled silicon articles formed by a mold 100 such as shown in FIGS. 12 and 13, respectively. As would be understood by one skilled in the art, any other surface texture/pattern desired in the cast article may be incorporated in the external surface 102 of a mold 100.

According to at least one embodiment of the present invention, mold 100 may be coated with particles, for example prior to being immersed or as mold 100 is immersed in the molten semiconducting material 104. It is believed that, in certain embodiments, a coating of particles may prevent the cast articles from sticking to mold 100, and may allow the crystals of the semiconducting material to grow uninterrupted, thereby resulting in larger grain size. In at least one embodiment, mold 100 may be coated with particles, for example inorganic particles. In at least one embodiment, the particles may be of high purity. According to at least one embodiment, the particles have an average size ranging from 10 nm to 2 μm. In at least one embodiment, the particles are nanoparticles having an average size of 100 nm or less, such as, for example, 30 nm or less. The particles may comprise any material suitable for use in the disclosed method. For example, in at least one embodiment, the particles may comprise silicon, silicon dioxide, silicon nitride, aluminum oxides, compounds of aluminum oxide, and/or glassy or crystalline compounds comprising aluminum and/or silicon, such as, for example, aluminosilicates.

In at least one exemplary embodiment, a coating of particles (for example, silicon nanoparticles) may be formed on mold 100 as the mold 100 is situated above the molten semiconducting material (for example, silicon). In one exemplary embodiment, a condensation process, whereby fumes from the molten semiconducting material condense on the relatively cold external surface 102 of mold 100, may form a coating of nanoparticles on the surface of mold 100 ("fume coating"). For example, molten silicon may generate nanoparticulate-laden fumes when heated above the melting temperature of silicon, for example in a range from 1450° C. to 1550° C. In at least one embodiment, mold 100 is exposed to the fumes above molten semiconducting material 104 for a suitable length of time, such as, for example, 10 seconds to 30 seconds, with mold 100 at a suitable initial starting temperature, such as 100° C. In at least one embodiment, fumes from molten semiconducting material 104 may combine or react with the atmosphere above molten semiconducting material 104. For example, particles deposited on a surface of mold 100 over molten silicon may comprise silicon (Si) and silicon oxides (SiO and $SiO_2$).

In a further exemplary embodiment, particles may be deposited on mold 100 as mold 100 is immersed in molten semiconducting material 104. In yet a further exemplary embodiment, particles may be deposited on mold 100 before mold 100 is immersed and also as mold 100 is being immersed in molten semiconducting material 104.

Figure 16:
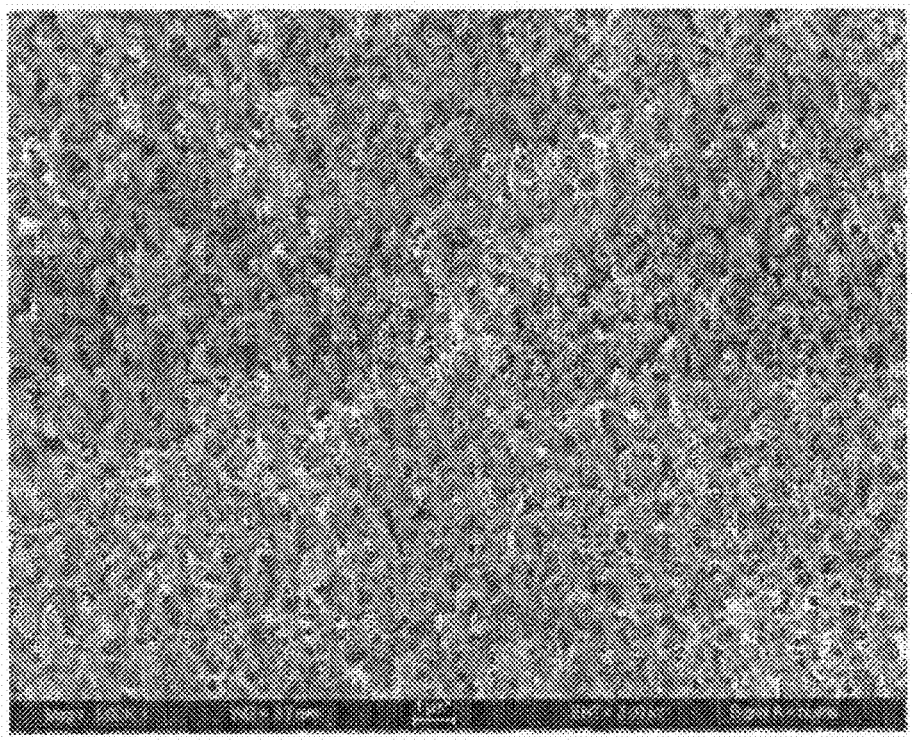
FIG. 16 is a micrograph of a particle-coated mold according to an embodiment of the invention.
Figure 17:
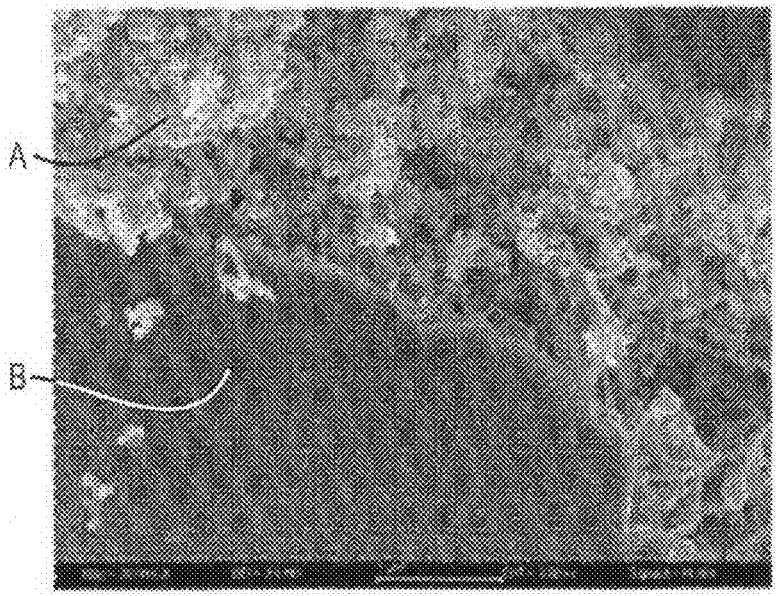
FIG. 17 is a micrograph showing a side view of the particle coated mold shown in FIG. 16.

In at least one embodiment, the coating on the mold 100 may be of sufficient thickness and coverage to provide the desired enhanced release of the article 110 from mold 100. By way of example only, a fume coating having a coverage of greater than 60% and a coating thickness ranging from 100 nm to 5 µm may be formed on the mold. In a further embodiment, a fume coating having a coverage of greater than 80% may be formed on the mold. In some embodiments, the coating may form a substantially contiguous coating of grouped or clustered particles, such as shown in FIG. 16. The coating may, in various embodiments, have discontinuities where the surface of mold 100 is exposed. The grouped or clustered particles may, in some embodiments, form a porous-like surface. A side view of a particle coated mold is shown in FIG. 17. In FIG. 17, groups or clusters of particles A may be seen over the mold B.

In various exemplary embodiments, particles deposited or applied on the mold 100 may not have the same composition as molten semiconducting material 104. In various other exemplary embodiments, particles deposited or applied on the mold 100 may have the same or substantially the same composition as molten semiconducting material 104. By way of example, in at least one embodiment, measures may be taken to ensure that the particles applied on the mold by the condensation process described are pure or substantially pure. According to at least one embodiment, the condensation process may be carried out in an enclosure having a highly reducing or low oxygen atmosphere, such as, for example, a dry mixture of pure argon with 2.5% hydrogen. In one embodiment, the atmosphere in the enclosure may optionally be scrubbed (e.g., continuously) of water, for example to levels below 1 ppm, and of oxygen, for example to levels below 5 ppm. The enclosure may optionally be slightly pressurized, for example to prevent ingress of atmospheric nitrogen. In at least one embodiment, low volatility carbon compounds may also be kept out of the enclosure.

In at least one further embodiment, rather than placing mold 100 in a fume generated by the molten semiconducting material 104, any non-contaminating surface (such as silicon or vitreous silica), that is relatively cold may be held in the fume to collect the particles. The particles may then be applied onto the surface of mold 100 in a separate process. In at least one embodiment, a suspension of particles may be prepared and applied onto the surface of mold 100 using methods such as dip-coating, rubbing, brushing, spraying, and pouring. In other embodiments, the particles may be applied by methods such as chemical vapor deposition (CVD), physical vapor deposition (PVD), plasma-enhanced chemical vapor deposition (PECVD), or induction plasma deposition. In at least one embodiment, mold 100 may be coated with particles from any suitable source.

Without wishing to be bound by any theory, it is hypothesized that when a mold 100 coated with particles is immersed in the molten material 104, the particles on the mold 100 form a physical barrier between the mold 100 and the molten semiconducting material 104 during the initial freezing event. It is believed that the particles then grow together to form a thin, weak, porous layer between the mold 100 and the solidified layer 110 during the remainder of the time the mold is immersed in the molten semiconducting material 104. During cooling of the mold 100 and solid layer 110, thermal mechanical stresses build up between the solid layer 110 and the mold 100 due to the difference in thermal expansion between the solid layer 110 and the mold 100. The porous layer of particles between the solid layer 110 and mold 100 then fractures, allowing the solid layer 110 to be removed more easily from the mold 100.

In at least one embodiment of the present invention, the disclosed method may be used to make a sheet of semiconducting material, such as, for example, a silicon sheet, having a surface area, geometry, thickness, and grain structure within the range of usefulness for photovoltaic applications, for example a size up to approximately 156 mm×156 mm, thickness in a range of 100 µm to 400 µm, and a substantial number of grains larger than 1 mm. According to one embodiment, at least 60% of the grains may be larger than 1 mm. In a further embodiment, at least 80% or at least 90% of the grains may be larger than 1 mm. In at least one embodiment, the grains are two to three times greater in size in their narrowest lateral direction than they are thick.

In at least one embodiment of the present invention, the disclosed methods yield articles of semiconducting material at an improved rate and/or having a reduction in wasted material. For example, the exocasting processes described herein can be performed with essentially no waste of semiconducting elements, since all the melted material can be cast into a useful article. Any broken pieces or other unused material can be remelted and cast again. In at least one embodiment, immersion cycle times (i.e., the sum of time to immerse the mold, the immersion time, and the time to withdraw the mold) of less than 5 seconds are used to form sheets 7 cm in length (independent of width), which translates to a process speed of a few centimeters per second.

Unless otherwise indicated, all numbers used in the specification and claims are to be understood as being modified in all instances by the term "about," whether or not so stated. It should also be understood that the precise numerical values used in the specification and claims form additional embodiments of the invention. Efforts have been made to ensure the accuracy of the numerical values disclosed herein. Any measured numerical value, however, can inherently contain certain errors resulting from the standard deviation found in its respective measuring technique.

It is noted that, as used in this specification and the appended claims, the singular forms "a," "an," and "the," include plural referents unless expressly and unequivocally limited to one referent, and vice versa. Thus, by way of example only, reference to "a heat source" can refer to one or more heat sources, and reference to "a semiconducting material" can refer to one or more semiconducting materials. As used herein, the term "include" and its grammatical variants are intended to be non-limiting, such that recitation of items in a list is not to the exclusion of other like items that can be substituted or added to the listed items.

It will be apparent to those skilled in the art that various modifications and variation can be made to the programs and methods of the present disclosure without departing from the scope its teachings. Other embodiments of the disclosure will be apparent to those skilled in the art from consideration of the specification and practice of the teachings disclosed herein. It is intended that the embodiments described in the specification be considered as exemplary only.

We claim:

1. A method of controlling the thickness of an unsupported article of a semiconducting material during formation of the unsupported article, comprising:
   providing a mold at a temperature $T_{Mold}$;
   providing a molten semiconducting material at a temperature $T_S$, wherein $T_S > T_{Mold}$;
   immersing the mold in the molten semiconducting material for a period of time sufficient for solid layers of semiconducting material to form over opposing external surfaces of the mold and begin to remelt;

withdrawing the mold with the solid layers of semiconducting material from the molten semiconducting material; and separating the solid layers of semiconducting material from the mold to form the unsupported article of the semiconducting material.

2. The method of claim 1, further comprising:

controlling a rate at which the mold is withdrawn from the molten semiconducting material to control formation of a drag layer of molten semiconducting material on the solid layers of semiconducting material as the mold is withdrawn.

3. The method of claim 1, further comprising:

coating the external surfaces of the mold with particles prior to immersing the mold in the molten semiconducting material and/or as the mold is immersed in the molten semiconducting material.

4. The method of claim 3, wherein the particles comprise silicon, silicon oxides, silicon nitride, aluminum oxides, aluminum silicate, or combinations thereof.

5. The method of claim 3, wherein coating the external surfaces of the mold with particles comprises exposing the mold to fumes above the molten semiconducting material for a period of time sufficient to form particles generated by the molten semiconducting material on the external surfaces of the mold.

6. The method of claim 3, wherein coating the external surfaces of the mold with particles comprises spraying, rubbing, brushing, pouring, dip-coating, chemical vapor deposition, physical vapor deposition, plasma enhanced chemical vapor deposition, or plasma induction deposition of the particles on the external surfaces of the mold.

7. The method of claim 3, wherein the particles coating the external surfaces of the mold form a substantially contiguous coating of particles.

8. The method of claim 1, wherein the mold comprises vitreous silica.

* * * * *